(12) United States Patent
Luo

(10) Patent No.: US 7,311,534 B2
(45) Date of Patent: Dec. 25, 2007

(54) CPU MOUNTING APPARATUS

(75) Inventor: Yong-Min Luo, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 137 days.

(21) Appl. No.: 11/203,390

(22) Filed: Aug. 11, 2005

(65) Prior Publication Data
US 2006/0034059 A1 Feb. 16, 2006

(30) Foreign Application Priority Data
Aug. 11, 2004 (CN) .................. 2004 2 0082914

(51) Int. Cl.
*H01R 13/44* (2006.01)
(52) U.S. Cl. ..................... 439/135; 439/940
(58) Field of Classification Search ............ 439/940, 439/135, 155, 152; 29/741, 758, 764, 740; 7/107; 294/104; D8/52; D28/55
See application file for complete search history.

(56) References Cited

U.S. PATENT DOCUMENTS 4,521,959 A * 6/1985 Sprenkle ...................... 29/741
5,065,282 A * 11/1991 Polonio ...................... 361/752
5,875,544 A * 3/1999 Chou ............................ 29/741
6,969,266 B2 * 11/2005 Chu et al. ...................... 439/70

FOREIGN PATENT DOCUMENTS

TW 87215147 2/2002

* cited by examiner

*Primary Examiner*—Alexander Gilman
(74) *Attorney, Agent, or Firm*—Morris Manning Martin LLP; Tim Tingkang Xia, Esq.

(57) ABSTRACT

A mounting apparatus to mount a CPU (53) to a socket (52) includes a base (20), a fixing member (50), a pair of clipping members (30), a pair of operation members (40) and a pair of resilient members (80). The base defines a concave (26) adapted to accommodate the CPU therein. The fixing member is arranged on a top of the base. Each clipping member includes a rotatable portion (313) respectively pivotably mounted to two opposite sides of a lower portion of the fixing member. Each clipping member includes a fixing portion (31) and a clipping portion (32) located at opposite sides of the rotatable portion respectively. A hook (322) extends downwardly from the clipping portion for hooking the CPU. The operation members are mounted to the fixing portions of the fixing member. Each of the resilient members is located between the fixing member and a corresponding operation member.

20 Claims, 7 Drawing Sheets

CPU MOUNTING APPARATUS

CROSS-REFERENCE TO RELATED APPLICATIONS

Relevant subject matter is disclosed in two co-pending U.S. Patent Applications entitled "CPU mounting apparatus", respectively file in Nov. 16, 2004 with the application Ser. No. 10/989,700, and Apr. 13, 2005 with the application Ser. No. 11/105,208, assigned to the same assignee with this application.

BACKGROUND OF THE INVENTION

1. Field of the Invention

The present invention relates to mounting apparatus for CPUs, and particularly to a mounting apparatus for readily and securely installing or removing a CPU to or from a socket.

2. General Background

Conventionally, a central processing unit (CPU) is inserted into a socket connector directly. Referring to FIGS. 6 and 7, a socket 12' of an Intel Pentium 5 CPU 13' is mounted on a motherboard 1'. The socket 12' includes a plurality of pins 120' and two slots 121', 123' in two sides thereof for readily mounting the CPU 13'. The CPU 13' has a plurality of pads 130' corresponding to the pins 120' of the socket 12'. During installation, the CPU 13' is inserted into the socket 12' straightly. The CPU pads 130' engage with the mating socket pins 120'. However, some of the pins 120' are often damaged or bent when too much force is applied thereon or the force is inequality during forced manipulation. The damaged or bent pins can not connect with the pads 130' whereby a loose electrical connection is arisen. Moreover, it is rather inconvenient and laborious to insert the CPU into the socket by handwork.

What is needed is to provide a mounting apparatus which readily and securely attaches or removes a CPU to or from a socket.

SUMMARY

A mounting apparatus to mount a CPU to a socket includes a base, a fixing member, a pair of clipping members, a pair of operation members and a pair of resilient members. The base defines a concave adapted to accommodate the CPU therein. The fixing member is arranged on a top of the base. Each clipping member includes a rotatable portion respectively pivotably mounted to two opposite sides of a lower portion of the fixing member. Each clipping member includes a fixing portion and a clipping portion located at opposite sides of the rotatable portion respectively. A hook extends downwardly from the clipping portion for hooking the CPU. The operation members are mounted to the fixing portions of the fixing member. Each of the resilient members is located between the fixing member and a corresponding operation member.

Other objects, advantages and novel features will become more apparent from the following detailed description when taken in conjunction with the accompanying drawings, in which:

DETAILED DESCRIPTION OF THE EMBODIMENT

Figure 1:
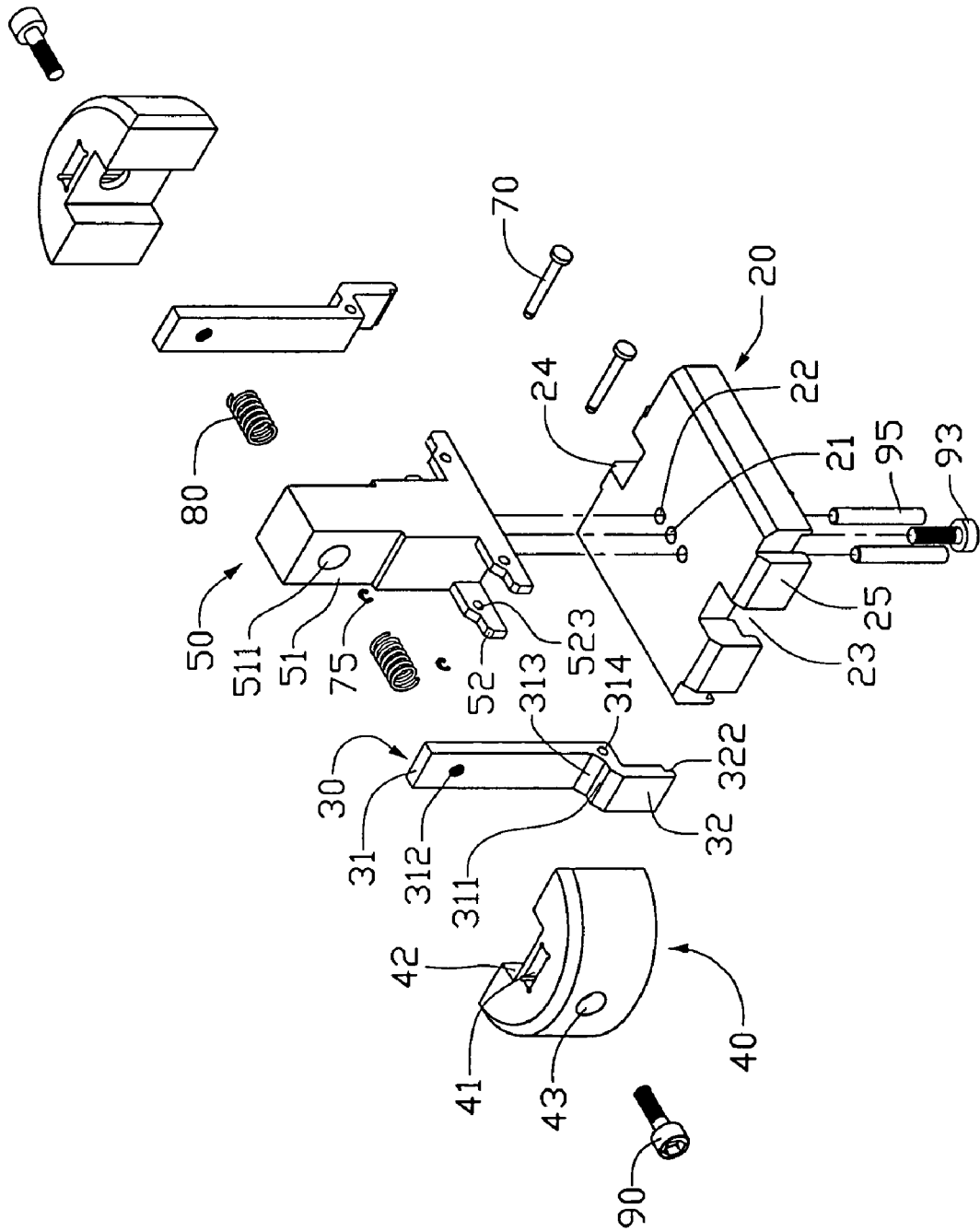
FIG. 1 is an exploded, isometric view of a mounting apparatus in accordance with a preferred embodiment of the present invention.
Figure 2:
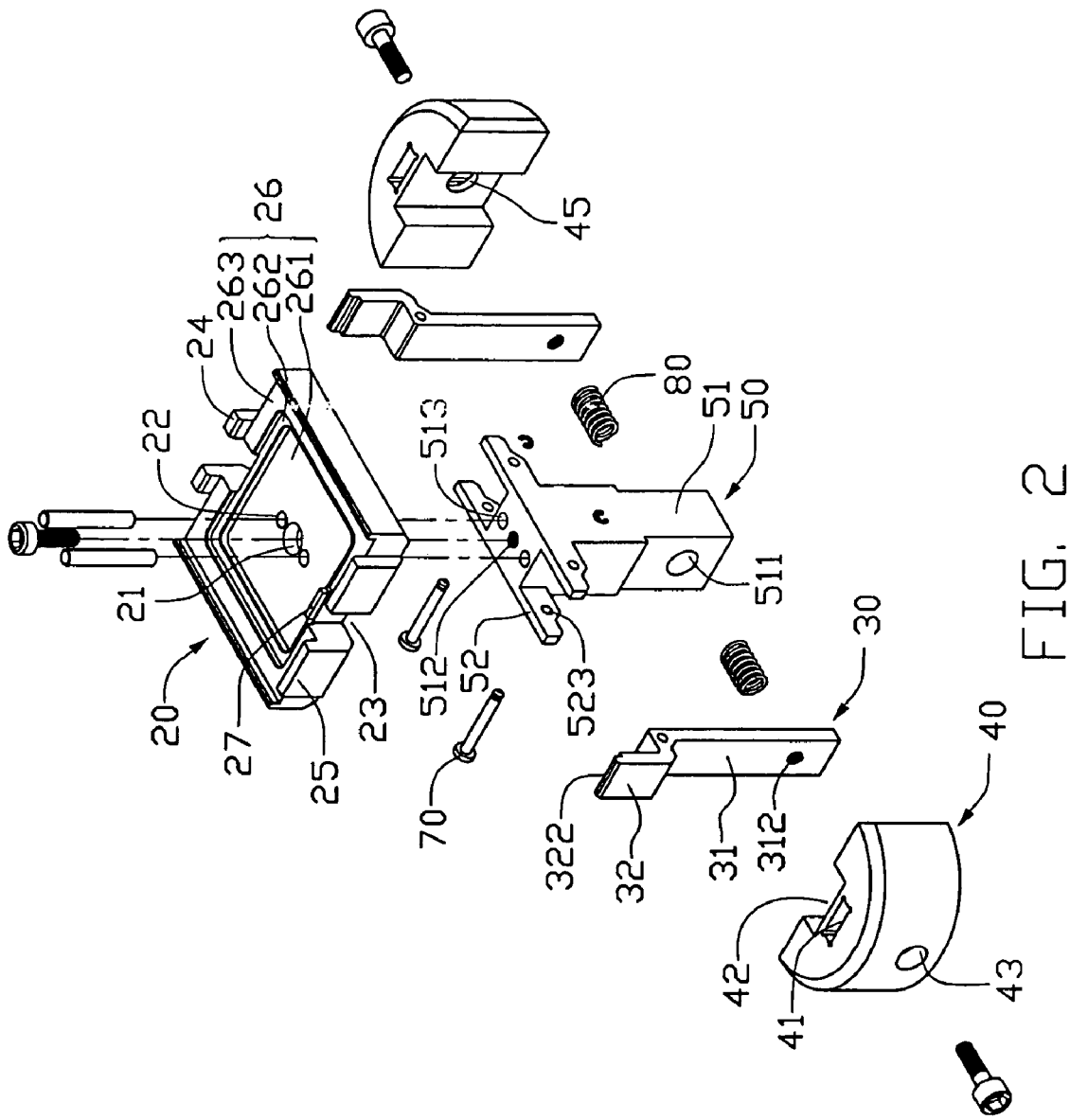
FIG. 2 is similar to FIG. 1, but viewed from another aspect.
Figure 3:
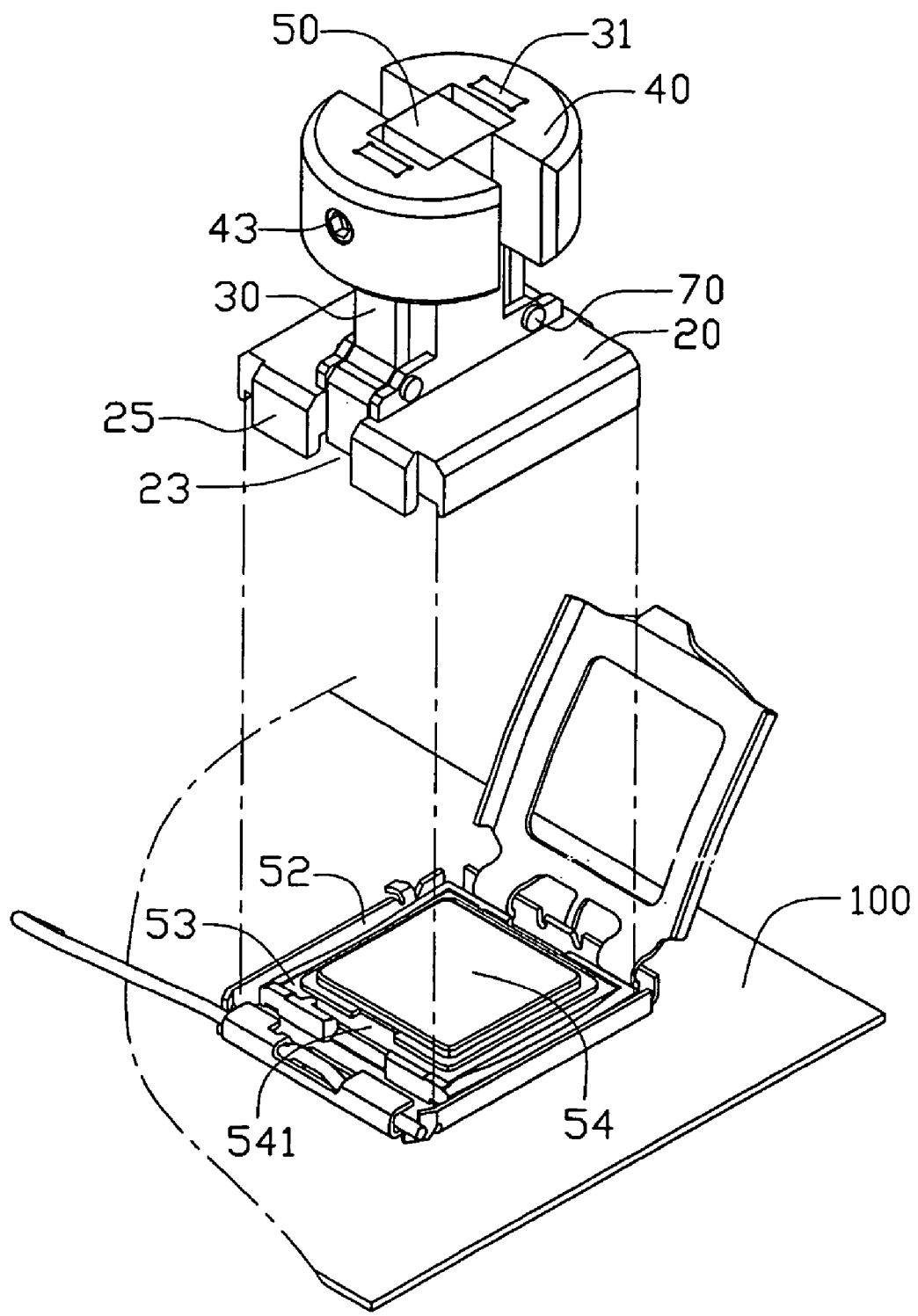
FIG. 3 is an assembled view of FIG. 1, together with a CPU, a socket, and a motherboard.

Referring to FIGS. 1, 2 and 3, a CPU mounting apparatus in accordance with a preferred embodiment of the present invention is shown for mounting a CPU 53 to a socket 52 on a motherboard 100. The CPU mounting apparatus includes a base 20, a fixing member 50, a pair of clipping members 30, a pair of operation members 40 and a pair of resilient members 80.

The base 20 has a concave 26 in a bottom thereof. The concave 26 having a stepped shape includes an inner concave 261, a middle concave 262 and an outer concave 263. A stepped heat sink 54 arranged on a top of the CPU 53 can be held in the inner concave 261 and the middle concave 262. The CPU 53 can be held in the outer concave 263. Two first cutouts 23 are defined in two opposite sides of the base 20 respectively. A protrusion 27 protrudes from the middle concave 262 in one cutout 23. The protrusion 27 has a height equal to a height between the middle concave 262 and the outer concave 263. The protrusion 27 and a second cutout 541 defined in a side of the heat sink 54 can prevent the users from mistaking the direction of the CPU 53 being held in the CPU mounting apparatus. Two pairs of projecting portions 24, 25 protrude downwardly from both sides of the cutouts 23 of the base 20. Different breadth of the two pairs of projecting portions 24, 25 can prevent the users from mistaking the direction of mounting the CPU 53 to the socket 52. A locking hole 21 is defined in the base 20. Two first orientation holes 22 are defined in the base 20 at opposite sides of the locking hole 21.

The fixing member 50 generally having a T shape includes a main body 51 and two pairs of mounting tabs 52 extending from two opposite sides of a lower portion of the main body 51. A first pivoting hole 523 is defined in each mounting tab 52. Two first containing holes 511 are defined in two opposite sides of an upper portion of the main body 51. A screw hole 512 is defined in a bottom of the fixing member 50. Two second orientation holes 513 are defined in the bottom of the fixing member 50 at two opposite sides of the screw hole 512.

Each clipping member 30 includes a vertical fixing portion 31, a horizontal connecting portion 311 extending from a lower portion of the fixing portion 31 and a vertical clipping portion 32 extending downwardly from an end portion of the connecting portion 311. A rotatable portion 313 is formed at a junction of the fixing portion 31 and the connecting portion 311. A second pivoting hole 314 is transversely defined in the rotatable portion 313. A hook 322 extends downwardly from a bottom of the clipping portion 32. A securing hole 312 is defined in an upper portion of the fixing portion 31.

Each operation member 40 has a general semicircle shape. A through hole 41 is vertically defined in the operation member 40 for receiving the fixing portion 31 of the corresponding clipping member 30. A sunken 42 is vertically defined in the operation member 40 at a side facing the fixing member 50. A fixing hole 43 is transversely defined in the operation member 40 from an outer surface thereof to the through hole 41. A second containing hole 45 is defined in the operation member 40 from the through hole 41 to the sunken 42.

Figure 4:
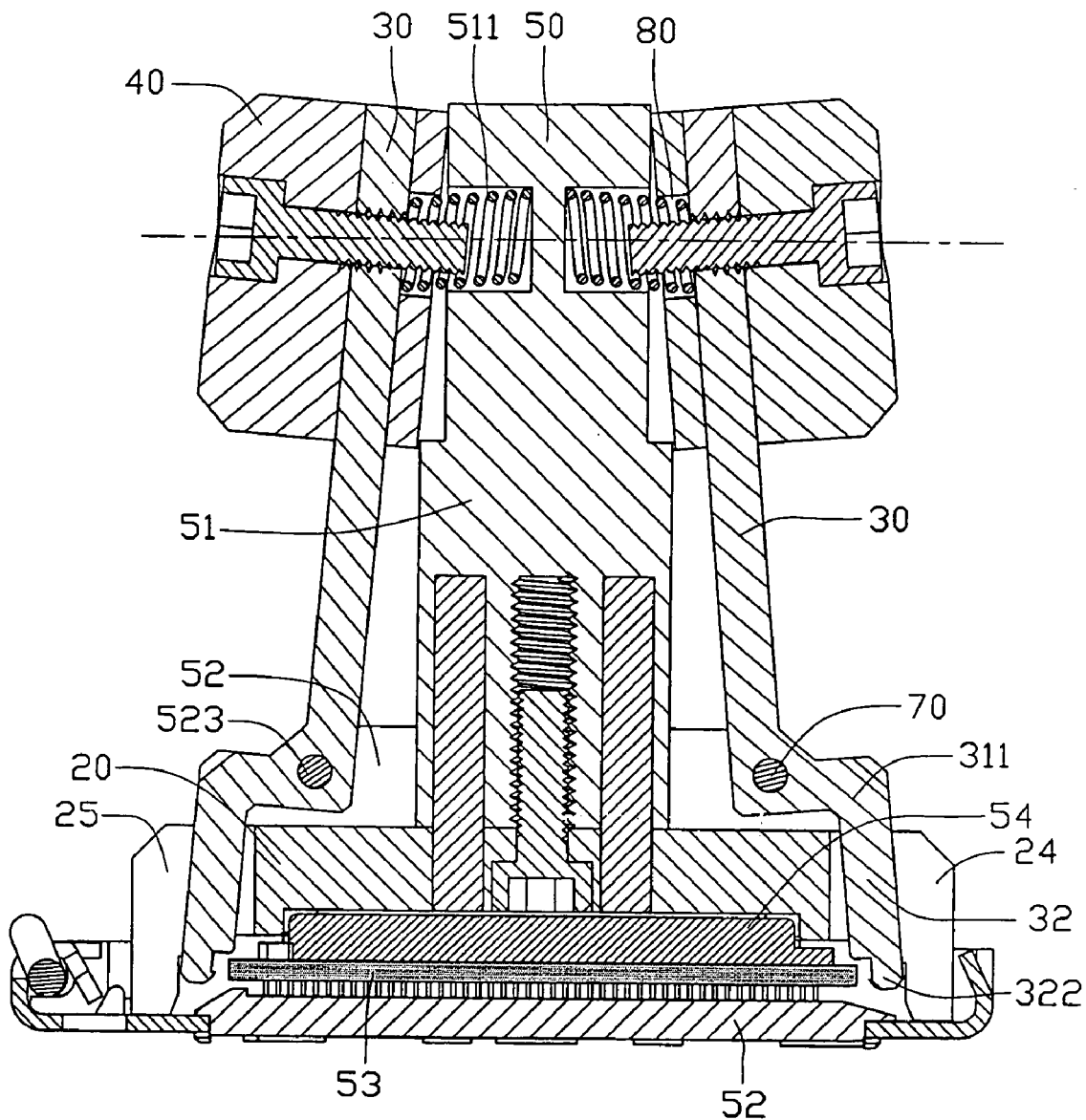
FIG. 4 is a cross-sectional view of an assembly of FIG. 3, showing operation members thereof being pressed.
Figure 5:
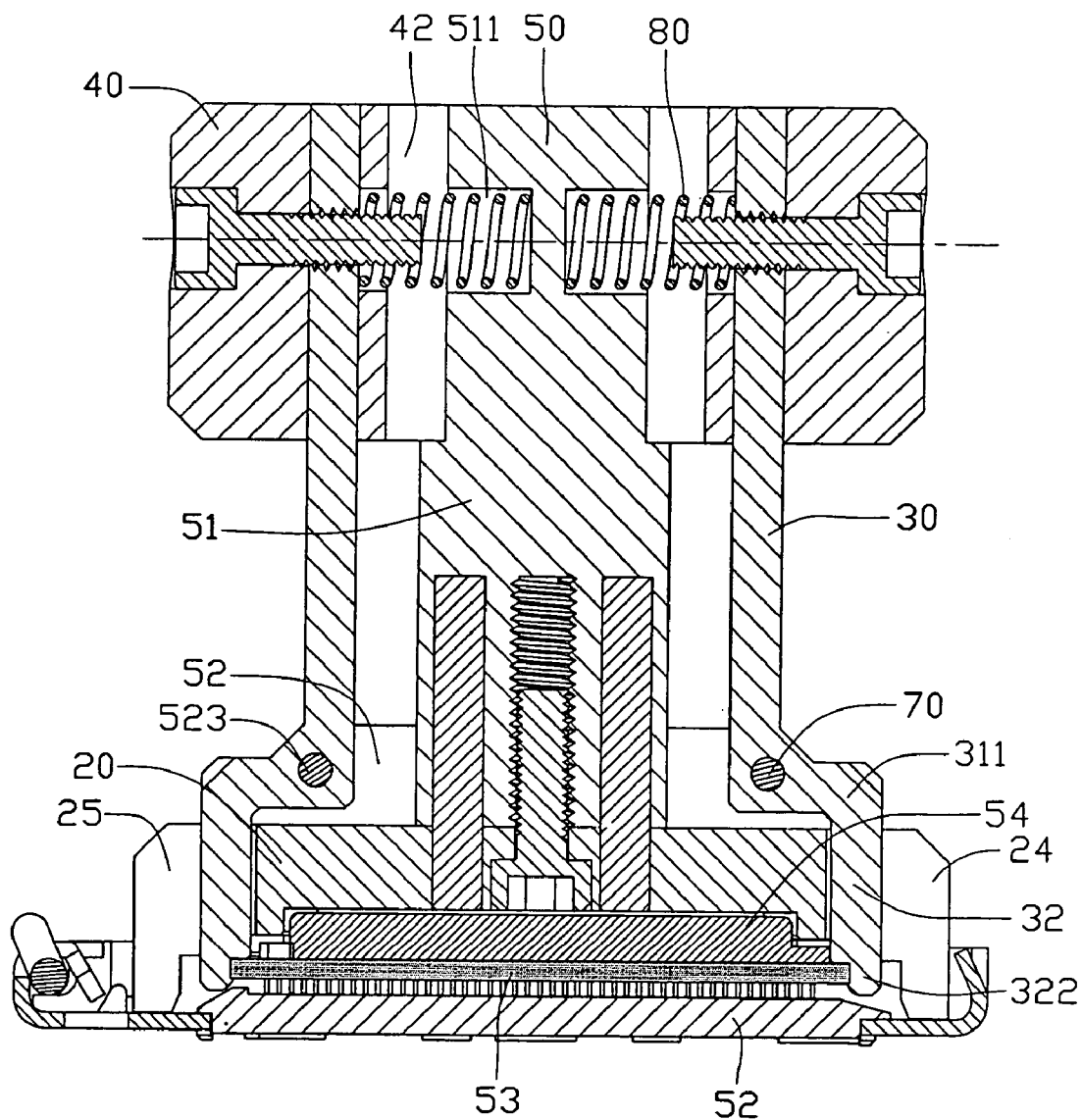
FIG. 5 is a cross-sectional view of an assembly of FIG. 3.
Figure 6:
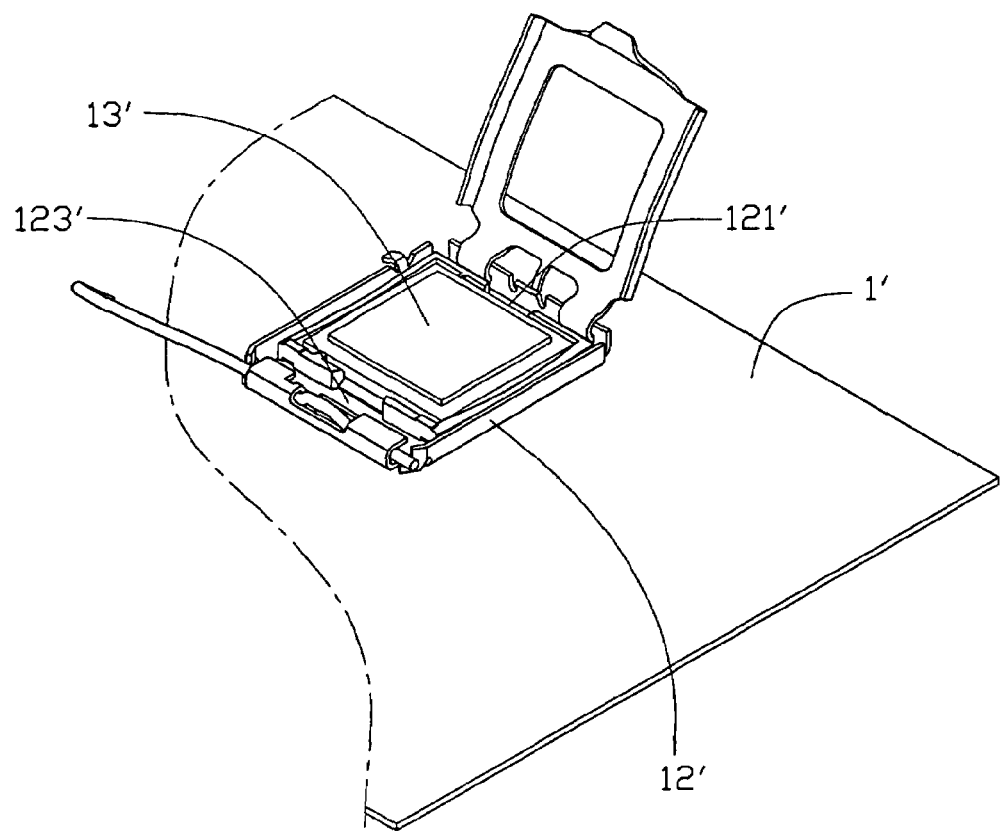
FIG. 6 is an assembled view of a conventional CPU, together with a socket, and a motherboard.
Figure 7:
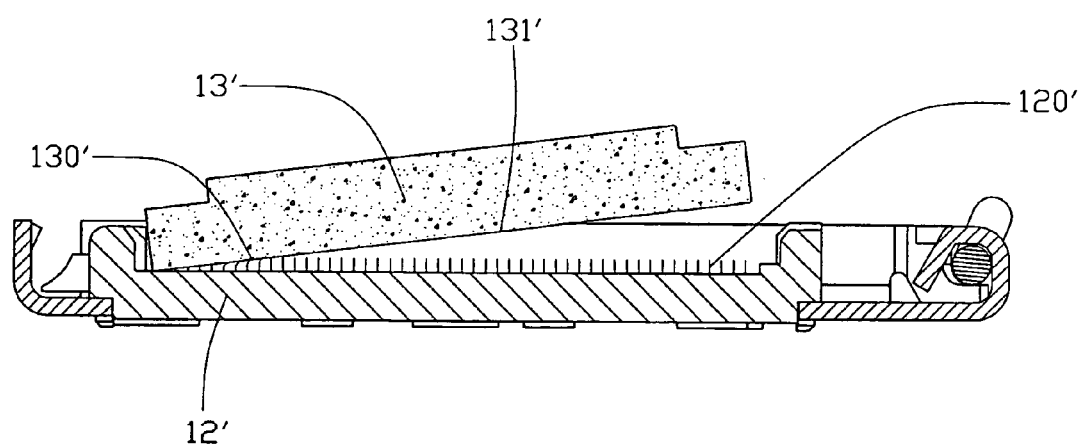
FIG. 7 is a cross-sectional view of an assembly of FIG. 6.

Referring also to FIGS. 3, 4 and 5, in assembling the CPU mounting apparatus, the fixing portions 31 of the clipping members 30 are received in the through holes 41 of the operation members 40 respectively, with the fixing holes 43 of the operation members 40 being in alignment with the securing holes 312 of the clipping members 30 respectively. Two screws 90 extend through the fixing holes 43 and are engaged in the securing holes 312 of the clipping members 30 respectively. Each of the resilient members 80 is received in the corresponding first containing hole 511 of the fixing member 50 and the second containing hole 45 of the corresponding operation member 40. Each of the clipping members 30 is located between the corresponding pair of mounting tabs 52, with the first pivoting holes 523 of the pair of mounting tabs 52 in alignment with the second pivoting hole 314 of the clipping member 30. A pivotable shaft 70 extends through one of the first pivoting holes 523 of the pair of the mounting tabs 52, the second pivoting hole 314 of the corresponding clipping member 30, the other of the first pivoting holes 523 of the pair of the mounting tabs 52, and is engaged in a fixing ring 75. The clipping members 30 are pivotably mounted to the fixing member 50. The clipping portions 32 of the clipping members 30 are situated in the cutouts 23 of the base 20 respectively. Each of the resilient members 80 is elastically located between the fixing member 50 and the fixing portion 31 of the corresponding clipping member 30. A screw 93 extends through the locking hole 21 from the bottom of the base 20 and is engaged in the screw hole 512 of the fixing member 50. Two pins 95 extend through the first orientation holes 22 from the bottom of the base 20 and are received in the second orientation holes 513 of the fixing member 50 respectively. Thus, the CPU mounting apparatus is formed.

In assembling the CPU 53 to the socket 52 of the motherboard 100, the pair of operation members 40 is pressed inwardly and the resilient members 80 are compressed together. The clipping members 30 rotate around the rotatable portions 313 respectively. The clipping portions 32 of the clipping members 30 spread outwardly. The CPU 53 and the heat sink 54 arranged on a top of the CPU 53 are inserted into the concave 26 of the base 20. The operation members 40 are released. The resilient members 80 resile to compel the operation members 40 and the clipping members 30 draw back. The clipping portions 32 of the clipping members 30 clip the hint sink 54 and the hooks 322 of the clipping members 30 hook the CPU 53. Thus, the CPU 53 and the heat sink 54 are pressed on the concave 26 of the base 20. A space surrounded between the bottom of the base 20 and the bottom portions of the projecting portions 24, 25 fittingly accommodates the socket 52 of the motherboard 100. After the CPU 53 is mounted to the socket 52, the operation members 40 are pressed. The clipping portions 32 and the hooks 322 are spread outwardly to release the CPU 53 and the heat sink 54. Thus, the CPU mounting apparatus can be removed from the CPU 53.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment.

I claim:

1. A mounting apparatus to mount a central processing unit (CPU) to a socket, the mounting apparatus comprising:
    a base defining a concave therein adapted to accommodate the CPU therein;
    a fixing member arranged on a top of the base;
    a pair of clipping members each having a rotatable portion respectively pivotably mounted to two opposite sides of a lower portion of the fixing member, each of the clipping members comprising a fixing portion and a clipping portion located at opposite sides of the rotatable portion respectively, a hook extending downwardly from the clipping portion for hooking the CPU;
    a pair of operation members mounted to the fixing portions of the clipping members respectively, to provide finger holds for operating the clipping members; and
    a pair of resilient members each connected to the fixing member with an end, and a corresponding operation member with an opposite end.

2. The mounting apparatus as claimed in claim 1, wherein a pair of cutouts is defined at two opposite sides of the base respectively for situating the clipping portions of the clipping members.

3. The mounting apparatus as claimed in claim 2, wherein a protrusion protrudes from the concave in one of the cutouts, for avoiding mistaking a direction of the CPU being held in the concave.

4. The mounting apparatus as claimed in claim 2, wherein two pairs of projection portions protrude downwardly from both sides of the cutouts of the base respectively, for fittingly accommodating the socket of the motherboard.

5. The mounting apparatus as claimed in claim 1, wherein a locking hole is defined in the base, a screw hole is defined in a bottom of the fixing member corresponding to the locking hole of the base.

6. The mounting apparatus as claimed in claim 5, wherein a pair of first orientation holes is defined in the base at two opposite sides of the locking hole, a pair of second orientation holes is defined in the bottom of the fixing member at two opposite sides of the screw hole corresponding to the first orientation holes of the base.

7. The mounting apparatus as claimed in claim 1, wherein the fixing member generally having a T shape comprises a main body and two pairs of mounting tabs extending outwardly from two opposite sides of a lower portion of the main body, each of the rotatable portions of the clipping members is pivotably mounted between a corresponding pair of the mounting tabs.

8. The mounting apparatus as claimed in claim 7, wherein a first pivoting hole is defined in each of the mounting tabs, each of the clipping members further comprises a connecting portion connecting the fixing portion and the clipping portion, the rotatable portion of each of the clipping members is formed in a junction of the fixing portion and the connecting portion, a second pivoting hole is transversely defined in the rotatable portion of each of the clipping members corresponding to the first pivoting hole.

9. The mounting apparatus as claimed in claim 1, wherein a vertical through hole is defined in each of the operation members for receiving the fixing portion of the corresponding clipping member.

10. The mounting apparatus as claimed in claim 9, wherein a vertical sunken is defined in each of the operation members at a side facing the fixing member, a fixing hole is defined in each of the operation members from an outer surface thereof to the through hole, a securing hole is defined in the fixing portion of each of the fixing members corresponding to the fixing hole of the operation member.

11. The mounting apparatus as claimed in claim 10, wherein two first containing holes are defined in two opposite sides of an upper portion of the main body, a second containing hole is defined in each of the operation members from the through hole to the sunken, each of the resilient members is received in the first containing hole of a corresponding fixing member and the second containing hole of a corresponding operation member.

12. A mounting apparatus to mount a central processing unit (CPU) to a socket, the mounting apparatus comprising:
   a base defining a concave therein adapted to accommodate the CPU therein;
   a fixing member arranged on a top of the base;
   a pair of clipping members movably mounted to two opposite sides of the fixing member, each of the clipping members comprising a fixing portion and a clipping portion, a hook extending downwardly from each of the clipping portions for hooking the CPU; and
   a pair of operation members mounted to upper portions of the fixing portions of the clipping members respectively, to provide finger holds for operating the clipping members, the operation members being movable relative to the fixing member.

13. The mounting apparatus as claimed in claim 12, wherein the fixing member generally having a T shape comprises a main body and two pairs of mounting tabs extending outwardly from two opposite sides of a lower portion of the main body, each of the clipping members is pivotably mounted between a corresponding pair of the mounting tabs.

14. The mounting apparatus as claimed in claim 13, wherein a first pivoting hole is defined in each of the mounting tabs, each of the clipping members further comprises a fixing portion, a clipping portion and a connecting portion connecting the fixing portion and the clipping portion, a rotatable portion of each of the clipping members is formed in a junction of the fixing portion and the connecting portion, a second pivoting hole is transversely defined in the rotatable portion of each of the clipping members corresponding to the first pivoting hole.

15. The mounting apparatus as claimed in claim 12, wherein a vertical through hole is defined in each of the operation members for receiving the fixing portion of the corresponding clipping member.

16. The mounting apparatus as claimed in claim 15, wherein a vertical sunken is defined in each of the operation members at a side facing the fixing member, a fixing hole is defined in each of the operation members from an outer surface thereof to the through hole, a securing hole is defined in the fixing portion of each of the fixing members corresponding to the fixing hole of the operation member.

17. The mounting apparatus as claimed in claim 16, wherein two first containing holes are defined in two opposite sides of an upper portion of the main body, a second containing hole is defined in each of the operation members from the through hole to the sunken, a pair of resilient members each is received in the first containing hole of a corresponding fixing member and the second containing hole of a corresponding operation member.

18. A mounting apparatus to mount a central processing unit (CPU) to a socket, the mounting apparatus comprising:
   a base defining a concave therein adapted to accommodate the CPU therein;
   a fixing member arranged on a top of the base;
   a pair of clipping members each having a rotatable portion respectively pivotably mounted to two opposite sides of a lower portion of the fixing member, each of the clipping members comprising a fixing portion and a clipping portion located at opposite sides of the rotatable portion respectively, a hook extending downwardly from the clipping portion for hooking the CPU;
   a pair of operation members mounted to the fixing portions of the clipping members respectively, to provide finger holds for operating the clipping members; and
   a pair of resilient members each horizontally mounted between the fixing member and a corresponding operation member, to restore the operation members.

19. The mounting apparatus as claimed in claim 18, wherein a vertical through hole is defined in each of the operation members for receiving the fixing portion of a corresponding clipping member.

20. The mounting apparatus as claimed in claim 19, wherein two horizontal first containing holes are defined in opposite sides of the fixing member, a horizontal second containing hole is defined in each of the operation members, one end of a resilient members of the pair of resilient members is received in a corresponding first containing holes, and an opposite end of the resilient member is received in the second containing hole of a corresponding operation member.

* * * * *